US010741428B2

(12) United States Patent
Hunter et al.

(10) Patent No.: US 10,741,428 B2
(45) Date of Patent: Aug. 11, 2020

(54) SEMICONDUCTOR PROCESSING CHAMBER

(71) Applicant: Applied Materials, Inc., Santa Clara, CA (US)

(72) Inventors: Aaron Muir Hunter, Santa Cruz, CA (US); Mehran Behdjat, San Jose, CA (US); Niraj Merchant, San Francisco, CA (US); Douglas R. McAllister, Pleasanton, CA (US); Dongming Iu, Union City, CA (US); Kong Lung Chan, Newark, CA (US); Lara Hawrylchak, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 505 days.

(21) Appl. No.: 15/417,865

(22) Filed: Jan. 27, 2017

(65) Prior Publication Data

US 2017/0294325 A1    Oct. 12, 2017

Related U.S. Application Data

(60) Provisional application No. 62/320,861, filed on Apr. 11, 2016.

(51) Int. Cl.
*H01L 21/67* (2006.01)
*C23C 16/458* (2006.01)
(Continued)

(52) U.S. Cl.
CPC .... *H01L 21/67248* (2013.01); *C23C 16/4586* (2013.01); *C23C 16/45561* (2013.01);
(Continued)

(58) Field of Classification Search
None
See application file for complete search history.

(56) References Cited

U.S. PATENT DOCUMENTS 6,251,195 B1 * 6/2001 Wagener ........... H01L 21/67028
134/15
6,300,255 B1   10/2001 Venkataranan et al.
(Continued)

FOREIGN PATENT DOCUMENTS

| JP | 2004128019 A | 4/2004 |
|----|--------------|--------|
| JP | 2010272889 A | 12/2010 |

(Continued)

OTHER PUBLICATIONS

Japanese Office Action for Application No. 2018-553098 dated Dec. 24, 2019.

(Continued)

*Primary Examiner* — Karla A Moore
(74) *Attorney, Agent, or Firm* — Patterson + Sheridan, LLP

(57) ABSTRACT

A semiconductor processing apparatus is described that has a body with a wall defining two processing chambers within the body; a passage through the wall forming a fluid coupling between the two processing chambers; a lid removably coupled to the body, the lid having a portal in fluid communication with the passage; a gas activator coupled to the lid outside the processing chambers, the gas activator having an outlet in fluid communication with the portal of the lid; a substrate support disposed in each processing chamber, each substrate support having at least two heating zones, each with an embedded heating element; a gas distributor coupled to the lid facing each substrate support; and a thermal control member coupled to the lid at an edge of each gas distributor.

16 Claims, 5 Drawing Sheets

(51) Int. Cl.
*C23C 16/455* (2006.01)
*C23C 16/452* (2006.01)
*C23C 16/44* (2006.01)
*H01J 37/32* (2006.01)

(52) U.S. Cl.
CPC .... *H01L 21/67017* (2013.01); *H01L 21/6719* (2013.01); *C23C 16/4404* (2013.01); *C23C 16/4412* (2013.01); *C23C 16/452* (2013.01); *C23C 16/45565* (2013.01); *H01J 37/3244* (2013.01); *H01J 37/32477* (2013.01); *H01J 37/32899* (2013.01)

(56) References Cited

U.S. PATENT DOCUMENTS

| | | | |
|---|---|---|---|
| 6,402,848 B1 * | 6/2002 | Horiguchi | C23C 16/405 |
| | | | 118/715 |
| 6,495,233 B1 * | 12/2002 | Shmurun | C23C 16/455 |
| | | | 118/713 |
| 7,829,145 B2 | 11/2010 | Balasubramanian et al. | |
| 9,355,922 B2 | 5/2016 | Park et al. | |
| 2007/0028840 A1 * | 2/2007 | Qian | H01J 37/3244 |
| | | | 118/719 |
| 2009/0014127 A1 * | 1/2009 | Shah | H01J 37/32366 |
| | | | 156/345.29 |
| 2014/0374024 A1 | 12/2014 | Nguyen et al. | |
| 2015/0226540 A1 | 8/2015 | Rajagopalan et al. | |
| 2015/0380217 A1 | 12/2015 | Rocha-Alvarez et al. | |

FOREIGN PATENT DOCUMENTS

| | | |
|---|---|---|
| JP | 2011077147 A | 4/2011 |
| JP | 2013080940 A | 5/2013 |
| JP | 2014220046 A | 11/2014 |
| JP | 2015503248 A | 1/2015 |
| JP | 2015531171 A | 10/2015 |
| KR | 102005054952 A | 6/2005 |
| KR | 1020070037507 A | 4/2007 |
| KR | 20090001030 A | 1/2009 |
| KR | 20110032682 A | 3/2011 |
| KR | 1020160012942 A | 2/2016 |
| WO | 2015/116370 A1 | 8/2015 |

OTHER PUBLICATIONS

Korean Office Action for Application No. 10-2018-7032303 dated Jan. 28, 2020.
Taiwan Office Action for Application No. 106112003 dated Mar. 20, 2020.

* cited by examiner

SEMICONDUCTOR PROCESSING CHAMBER

CROSS-REFERENCE TO RELATED APPLICATIONS

This application claims benefit of U.S. Provisional Patent Application Ser. No. 62/320,861 filed Apr. 11, 2016, which is incorporated by reference herein.

BACKGROUND

Semiconductor devices continue to shrink in size. As the critical dimension of semiconductor device shrinks beyond 10 nm, new semiconductor materials are being investigated to overcome performance issues that become apparent using silicon at such scales. Increasingly, germanium is being included with silicon as an alloy to improve the semiconductive properties of various parts of the device. For example, channel areas, source drain areas, and contacts for the source and drain areas are increasingly being made of silicon-germanium alloys. As is typical of logic structures, these areas are usually doped with conductivity-enhancing materials, such as boron. As is also typical, the doping process is followed with an activation process to reduce resistance of the various structures and access the conductivity-enhancing features of the dopants. The channel and source/drain areas are typically doped and activated in separate steps, although in some processes these regions are doped and activated in one doping step and one thermal treatment step. The contact regions are typically doped and activated in subsequent steps. The small size of these regions gives rise to a high likelihood of degradation during subsequent thermal processing. It has been found that when commonly-used thermal processes are used to activate boron-doped silicon-germanium (SiGe:B) contacts, strain induced in the channel region can relax and dopant profile in the channel and source/drain regions can degrade. A thermal process is needed that can activate doped contacts in 10 nm and smaller devices.

SUMMARY

Embodiments described herein provide a semiconductor processing apparatus, comprising a body with a wall defining two processing chambers within the body; a passage through the wall forming a fluid coupling between the two processing chambers; a lid removably coupled to the body, the lid having a portal in fluid communication with the passage; a gas activator coupled to the lid outside the processing chambers, the gas activator having an outlet in fluid communication with the portal of the lid; a substrate support disposed in each processing chamber, each substrate support having at least two heating zones; a gas distributor coupled to the lid facing each substrate support; and a thermal control member coupled to the lid at an edge of each gas distributor.

Other embodiments provide a semiconductor processing apparatus, comprising a body with a wall defining two processing chambers within the body; a passage through the wall forming a fluid coupling between the two processing chambers; a lid removably coupled to the body, the lid having a portal in fluid communication with the passage; a gas activator coupled to the lid outside the processing chambers, the gas activator having an outlet in fluid communication with the portal of the lid; a substrate support disposed in each processing chamber, each substrate support having at least two heating zones and a substrate supporting area comprising a plurality of substrate supporting surfaces extending from the substrate supporting area; a gas distributor coupled to the lid facing each substrate support; and a thermal control member coupled to the lid at an edge of each gas distributor.

Other embodiments provide a semiconductor processing apparatus, comprising a body with a wall defining two processing chambers within the body; a passage through the wall forming a fluid coupling between the two processing chambers; a lid removably coupled to the body, the lid having a portal in fluid communication with the passage; a remote plasma unit coupled to the lid outside the processing chambers, the remote plasma unit having an outlet in fluid communication with the portal of the lid; a substrate support disposed in each processing chamber, each substrate support having at least two heating zones and a substrate supporting area comprising a plurality of substrate supporting surfaces extending from the substrate supporting area; a gas distributor coupled to the lid facing each substrate support; and a thermal control member coupled to the lid at an edge of each gas distributor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
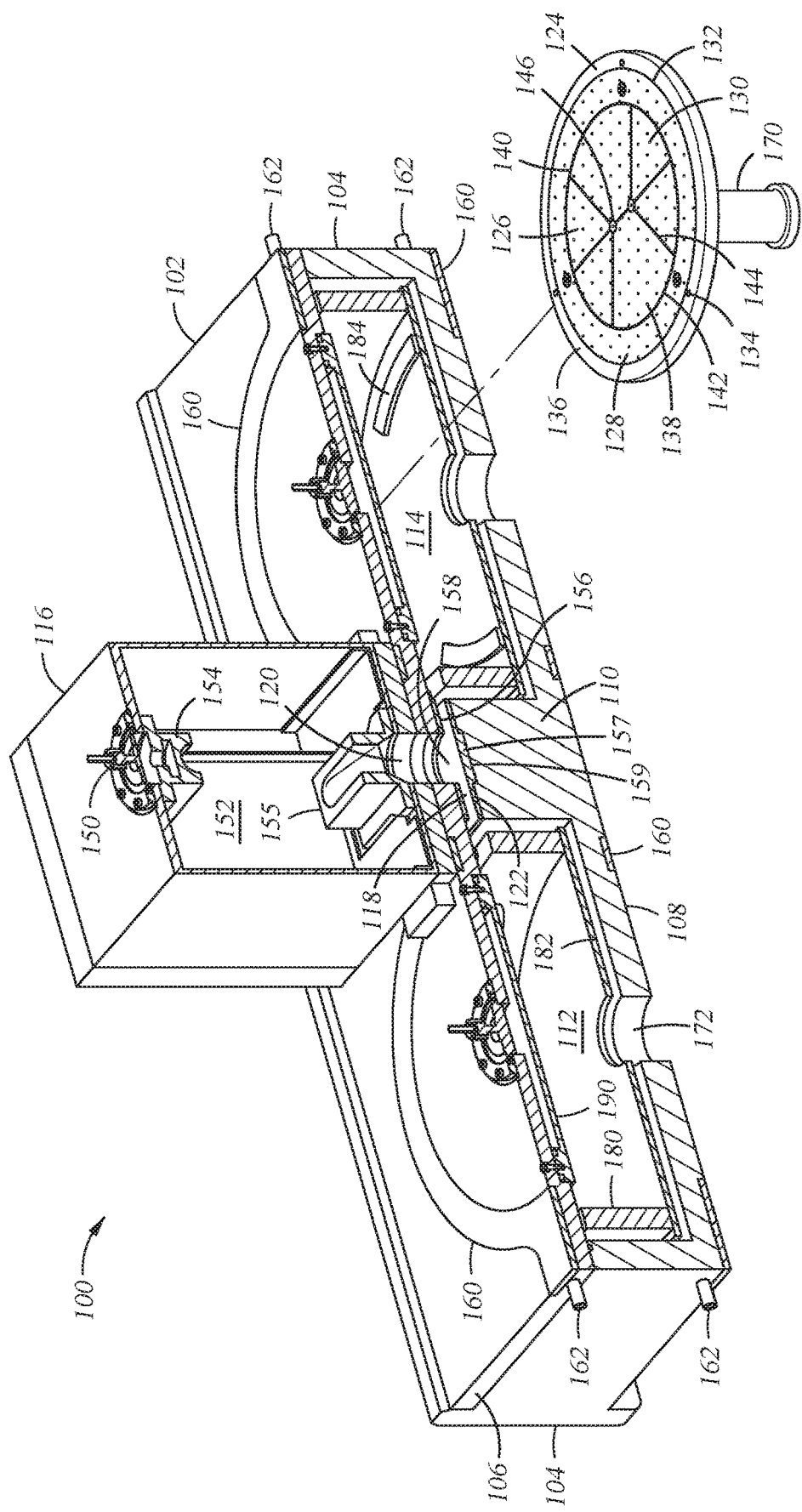
FIG. 1 is a perspective cross-sectional view of a semiconductor processing apparatus according to one embodiment.

FIG. 1 is a perspective cross-sectional view of a semiconductor processing apparatus 100 according to one embodiment. The apparatus 100 includes a body 102 that has two sidewalls 104 and a floor 108 coupling the two sidewalls 104 together. A lid 106 is removably coupled to the body 102 opposite the floor 108. The body 102 also has a dividing wall 110 defining two processing chambers 112 and 114 within the body. The semiconductor apparatus 100 may thus be described as a twin-chamber apparatus. A gas activator 116 is coupled to the lid 106 for providing activated gases to the processing chambers 112, 114. A passage 118 through the wall 110 fluidly coupled the processing chambers 112, 114 together, and an outlet 120 of the gas activator 116 is in fluid communication with the passage through a portal 122 formed in the lid 106.

Each chamber 112, 114, has a substrate support 124, only one of which is shown in FIG. 1 for simplicity. The substrate support 124 is disposed inside the chamber at a central location thereof. The substrate support 124 has at least two heating zones 126 and 128, each with an embedded heating element 131, which may be a resistive element or a fluid conduit. Each substrate support 124 has a substrate support area 130. The substrate support area 130 features a surface material that is compatible with substrates to be processed thereon and with the processing environment in the chamber. Exemplary materials include quartz and ceramics such as aluminum oxide and aluminum nitride. The substrate support area 130 is defined by a wall 132 that surrounds the substrate support area 130. A substrate typically rests on the substrate support area 130, and may contact the wall around all or part of the circumference of the substrate. A plurality of location features 134 extend from the wall and help locate a substrate onto the substrate support area 130 when the substrate is delivered to the substrate support 124. The wall 132 also defines a rim 136 of the substrate support. The wall 132 may have a height of about 1 μm to about 500 μm, such as about 5 μm to about 50 μm, for example about 10 μm.

The substrate support area 130 has a plurality of support surfaces 138 extending from the substrate support area 130. The substrate support surfaces 138 are elevated above the substrate support area 130 to provide minimal contact between the substrate support 124 and a substrate resting thereon. The substrate support surfaces 138 may have a height of from about 1 μm to about 500 μm, such as from about 5 μ to about 50 μm, for example about 25 μm. The substrate support surfaces 138 may be cylindrical posts or rounded bumps.

The substrate support area 130 also has a plurality of grooves 140 formed thereon. A circumferential groove 142 proceeds around a circumference of the substrate support area 130, while a plurality of straight grooves 144 proceed from the circumferential groove 142 toward a central region of the substrate support area 130. One or more portals 146, in the embodiment of FIG. 1 there are two portals 146, are provided in the central region of the substrate support area 130 for application of vacuum. The substrate support 124 is a vacuum chuck, but an electrostatic chuck, or another securing mechanism, may be used. The portals 144 provide fluid communication between a vacuum source (not shown) and the substrate supporting area 130 to apply a reduced pressure to the side of the substrate in contact with the substrate support surface 138. Gas flows over the substrate supporting area 130 around the substrate support surface 138 and along the grooves 140. In the embodiment of FIG. 1, two straight grooves 144 proceed from each portal 146, and one straight groove 144 proceeds along a diameter of the substrate support 124 from one side of the circumferential groove 142 to the other contacting both portals 146. It should be noted that any convenient arrangement of grooves may be used.

In one embodiment, the substrate support 124 can operate at a temperature of up to 450° C. Such a substrate support 124 may be made of a material, or a plurality of materials, that can withstand such high temperatures. In the case wherein the substrate support 124 is made of a plurality of materials, the materials are joined in a way that can withstand the high temperatures without degrading or detaching. It is also helpful in some cases for the materials of the substrate support to be resistant to chemical attack from substances that may be emitted by a substrate undergoing thermal processing. Quartz and ceramics, such as aluminum oxide and aluminum nitride, are suitable for many cases. In one embodiment, the substrate support 124 is monolithic aluminum nitride.

The substrate support 124 may have one or more temperature sensors embedded in the substrate support 124, and one or more temperature sensors external to the substrate support 124. For example, one or more thermocouples (not shown) may be embedded in the substrate support 124 to sense the temperature of the substrate support directly. Alternately, or in addition, a resistive temperature sensor may be coupled to the power circuit for the heating elements 1xx. In one embodiment, a thermocouple is embedded in the substrate support 124 to sense the temperature of an outer heating zone while a resistive temperature sensor is used to monitor the temperature of the inner heating zone. Such an arrangement simplifies the substrate support 124 by allowing embedded thermocouples only at the outer edge of the substrate support 124 where they may be easily accessed for maintenance.

The gas activator 116 may be a remote plasma unit in some cases. A gas inlet 150 allows gas to flow into an enclosure 152 and be energized by an activator 154, which may be thermal, electrical, or radiative in nature. Standard activators such as microwave, RF, and UV activators may be used. The gas activator 116 is a remote plasma unit that generates radicals to flow into the passage 122 and into the processing chambers 112 and 114. The outlet 120 of the gas activator 116 is a high flow outlet to minimize deactivation of radicals, so the gas flowing into the processing chambers has a high radical content. A funnel 155 directs flow of the radical gas in the enclosure 152 toward the outlet 120. The funnel 155 may be a chemically inactive material such as quartz or ceramic, such as aluminum oxide.

A chemically inactive liner 156 may be disposed in the passage 122 to minimize wall recombination as radicals flow into the processing chambers 112, 114. The liner 156 may be quartz, and may be attached to the wall of the passage 122 or removable. The liner 156 has an inlet 158 that aligns with the outlet 120 of the gas activator 116 to maintain fluid communication from the enclosure 152 of the gas activator 116 through the passage 122 (and the liner 156) into the processing chambers 112 and 114. If the liner 156 is removable, alignment features may be provided to position the liner 156 so the inlet 158 aligns with the outlet of the gas activator 116. In the embodiment of FIG. 1, a positioning feature 157 may be provided along an outer surface of the liner 156. In this case, the positioning feature 157 is circular, but the positioning feature 157 may be any convenient shape for longitudinal positioning of the liner 156. The positioning feature 157 matches a recess 159 in the surface of the passage 122. In the embodiment of FIG. 1, both the liner 156 and the passage 122 are rectangular in cross-section, so rotational alignment is assured. In embodiments wherein the passage 122 and liner 156 are circular in cross-section, the positioning feature may be a tab that extends from the outer surface of the liner 156 and matches a corresponding recess in the surface of the passage 122.

The liner 156 may extend partway along the passage 122, or the entire length of the passage 122. In some cases the liner 156 may extend beyond the passage 156 into the processing chambers 112, 114. In an example where the gas activator 116 is used to activate gases for substrate processing, the ends of the liner 156 may be located near the edge of the substrate support 124, for example near the edge of the substrate supporting area 130. The liner 156 has a constant area flow path from the center to the end of the liner 156. In other embodiments, however, the liner 156 may have an expanding flow path from center to end. In the embodiment of FIG. 1, the shape of the passage 122 matches the shape of the liner 156. In the case where the liner has an expanding flow path, the passage 122 may have a matching shape that expands from center to end, or a constant area cross-section that fits the liner at the ends thereof.

The apparatus 100 has a thermal control member 160 disposed in the lid 106. The thermal control member 160 includes a conduit (not visible in FIG. 1) disposed through the lid 106 that ends in a portal 162 for providing thermal control to the lid. The conduit may house a resistive element for heating, or may allow flow of a heat transfer medium for either heating or cooling. In cases wherein the gas activator 116 produces heat, a cooling medium may be used in the thermal control member 160 to control temperature at the lid 106. A similar thermal control member 160 is shown in the floor 108 of the apparatus 100.

The substrate support 124 features a conduit 170 for supplying power to electrical elements, such as heaters, temperature sensors, and chucking elements, in the substrate support 124. The conduit 170 may also be used to supply vacuum to the substrate support 124. The conduit fits into an opening 172 in the floor of each processing chamber 112, 114, to provide external access. The substrate support 124 faces a showerhead 190 in each processing chamber 112, 114, that is coupled to the lid 106.

Each processing chamber 112, 114, has one or more liners to prevent chemical reactions at the walls of the processing chambers 112, 114, and to improve thermal uniformity of the chambers. A wall liner 180, which may be cylindrical as shown in FIG. 1, generally protects the chamber walls from chemical attack and reduces chamber volume around the substrate support 124. A floor liner 182 protects the chamber floor 108 from chemical attack. A thermal liner 184 may also be provided to allow heating of the liners 180 and 182 to reduce thermal non-uniformities in the chamber. The thermal liner 184 may be installed between the chamber floor 108 and the floor liner 182, or the floor liner 182 may be installed between the chamber floor 108 and the thermal liner 184. The thermal liner 184 may include resistive heating elements, and connections through the floor of the processing chambers 112, 114 may provide electrical power to the thermal liner 184. Note that only one chamber of the apparatus 100 is shown with a thermal liner 184, but both chambers may have such a thermal liner.

The body 102 may be formed integrally as a unitary object, or each chamber 112, 114, may have sidewalls that can be coupled together, for example by bolting together, to make a twin-chamber arrangement with a dividing wall. The individual chambers in such an embodiment will each have a passage that together will form the passage 122 when the chambers are coupled together.

Figure 2:
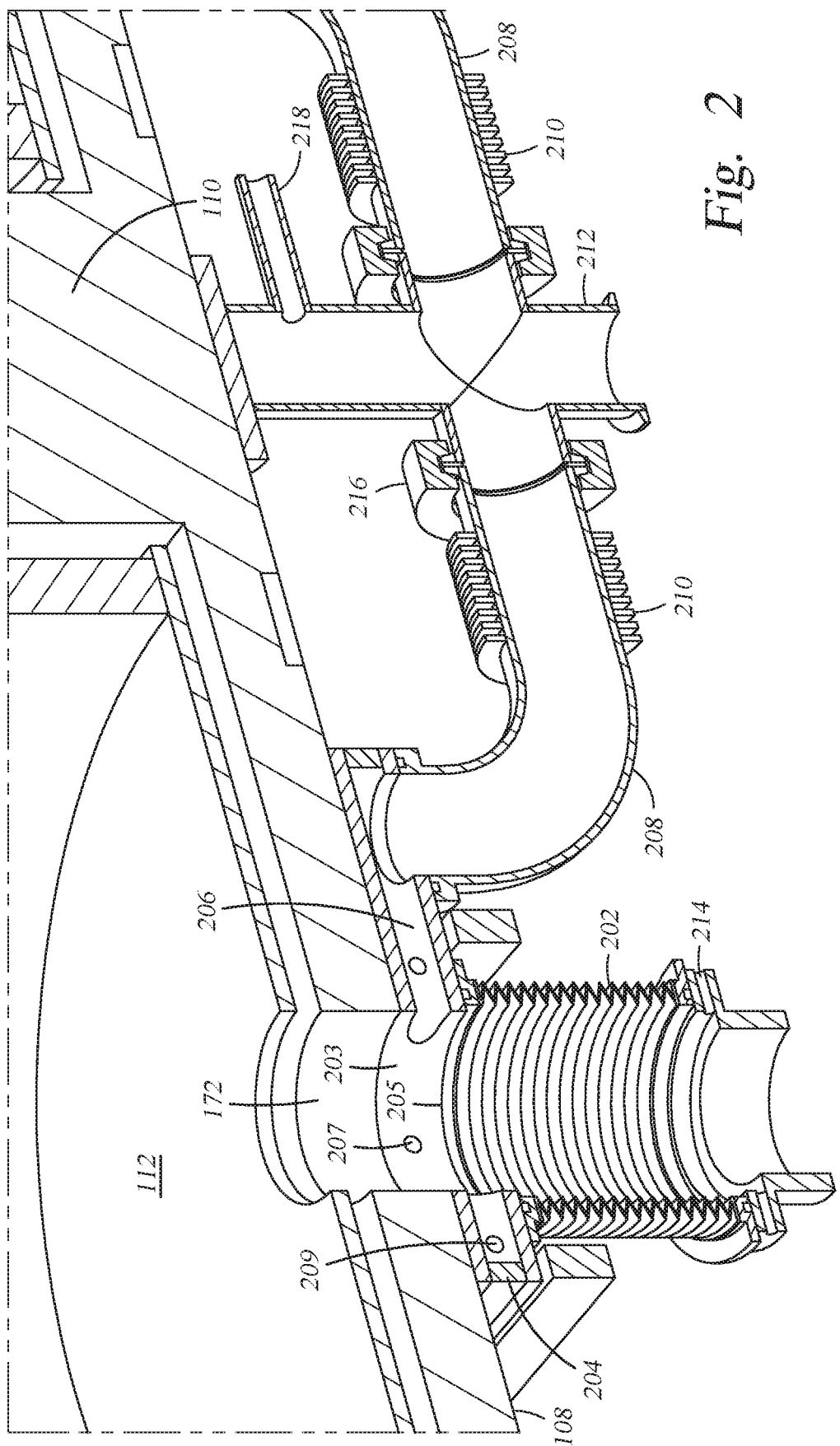
FIG. 2 is a detail view of the floor area of the apparatus of FIG. 1.

FIG. 2 is a detail view of the floor area of the apparatus 100. FIG. 2 includes features coupled to the floor 108 of the apparatus 100 that are not shown in FIG. 1. As noted above, the opening 172 allows the conduit 170 of the substrate support 124 to extend through the floor 108 of the apparatus 100. Each processing chamber 112, 114, is sealed by a bellows 202 that is coupled to the floor 108 by a pumping block 204. The pumping block 204 has an opening 203 that matches the opening 172 of the chamber floor 108. The opening 203 has a wall 205 with a plurality of pumping portals 207 that admit gases into an annular pumping channel 209 through the pumping block 204. An outlet 206 is coupled to the pumping channel 209 for removing gases from the processing chamber 112. The structure of the pumping block 204 provides symmetrical center pumping around the conduit 170 of the substrate support 124.

Gases flow into the processing chamber 112, around the substrate support 124, and toward the opening 172. The gases exit the chamber 112 through the opening 172 around the conduit 170 of the substrate support 124 (FIG. 1). The gases flow through the outlet 206 of the pumping block 204 into a chamber exhaust line 208 coupled to the pumping block 204. A heater 210 may be provided on part or all of the chamber exhaust line 208 to prevent deposition in the chamber exhaust line 208. The chamber exhaust line 208 of each chamber 112, 114, is coupled to a chamber pumping line 212, which is connected to a vacuum pump (not shown), by sealed flanges 216, providing a high conductance pumping pathway. A purge gas portal 218 may be provided to the chamber pumping line 212.

The bellows 202 has a purge gas portal 214 for providing purge gas into the bellows 202 around the conduit 170 of the substrate support 124. A purge gas source (not shown) may be coupled to the purge gas portal 214 to flow purge gas into the bellows 202 and up toward the outlet 206 to prevent chamber process gases from forming deposition on internal surfaces of the bellows 202. In the event the gas activator 116 (FIG. 1) is used to activate cleaning gases, the purge gas flow into the bellows 202 may be discontinued to allow cleaning gases to contact internal surfaces of the bellows 202 and remove any unwanted deposition thereon. Alternately, in the event interaction between the cleaning gases and the bellows 202 is not desired, purge gas flow can be maintained to prevent cleaning gases from entering the bellows 202. Each of the chambers 112 and 114 has an exhaust system with the foregoing elements.

Figure 3:
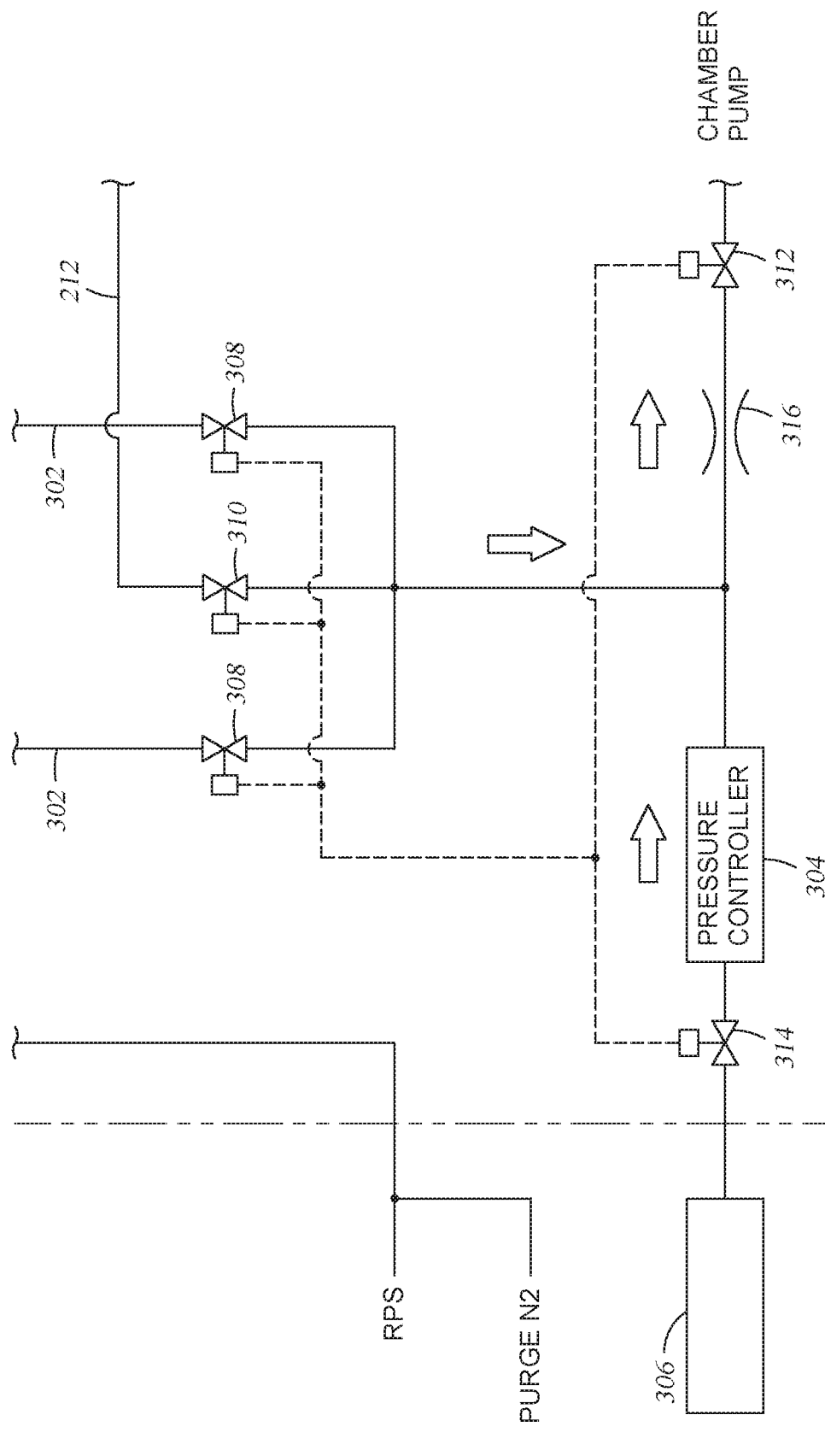
FIG. 3 is a schematic diagram of exhaust pumping flows for the apparatus of FIG. 1.

FIG. 3 is a schematic diagram of exhaust pumping flows for the apparatus 100. Lines 302 connect the substrate supporting area 130 (FIG. 1) of each substrate support 124 to the chamber pump as a vacuum source. The lines 302 are disposed through the conduit 170 and are connected to the chamber pumping line 212. A pressure controller 304 monitors chamber pressure and substrate chucking pressure, when vacuum chucking is used. A pressure control gas 306, typically an unreactive gas such as nitrogen, helium, or argon, is coupled into the chamber pumping line 212 to control pressure differential between the two major surfaces of a substrate disposed on the substrate support 124 for consistent chucking force. A flow restrictor 316 provides back-pressure to allow flow control. The pressure controller adjusts valves 308 in the lines 302, valves 310 and 312 in the chamber pumping line 212, and valve 314 to the pressure control gas 306, to control pressure differential. The pressure controller 304 may include the valve 314 in some cases. In this way, the pressure controller is not exposed to process gases exiting the processing chambers 112, 114.

Figure 4:
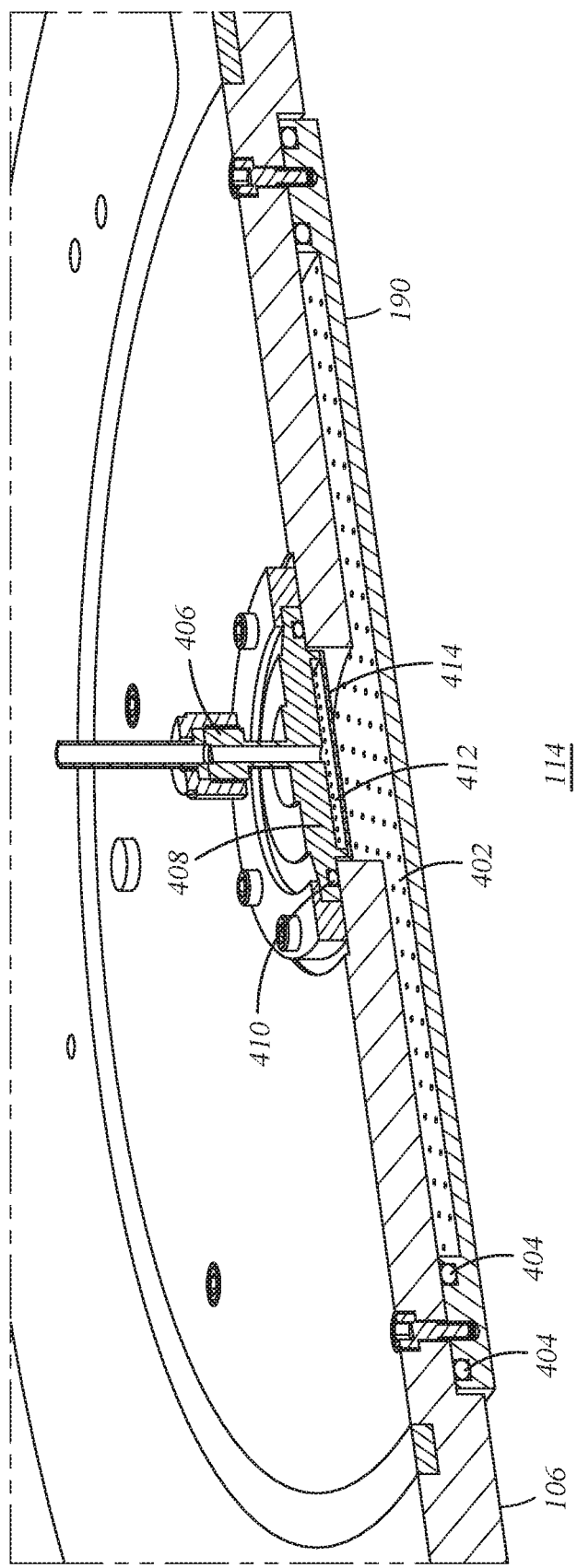
FIG. 4 is a detail view of the lid area of a processing chamber of the apparatus of FIG. 1.

FIG. 4 is a detail view of the lid area of the processing chamber 114 of the apparatus 100. FIG. 4 shows the showerhead 190 fastened to the lid 106, in this case using bolts. O-rings 404 seal the interface between the showerhead and the lid. Holes 402 through the showerhead 190 allow gas to flow through the showerhead into the chamber 114. Gas flows into the lid through an inlet portal 406 into a diffuser 408, which is sealed against the lid 106 by an o-ring 410. The diffuser 408 may have a plenum 412 and a plurality of openings 414 to distribute gas, thus avoiding flow concentrations at the center of the showerhead 190 that can cause thermal non-uniformities from gas jets. Alternately, the diffuser 408 may have a porous surface to flow gas to the showerhead 190. As noted above, each of the processing chambers 112, 114, has a showerhead as shown in FIG. 4.

Figure 5:
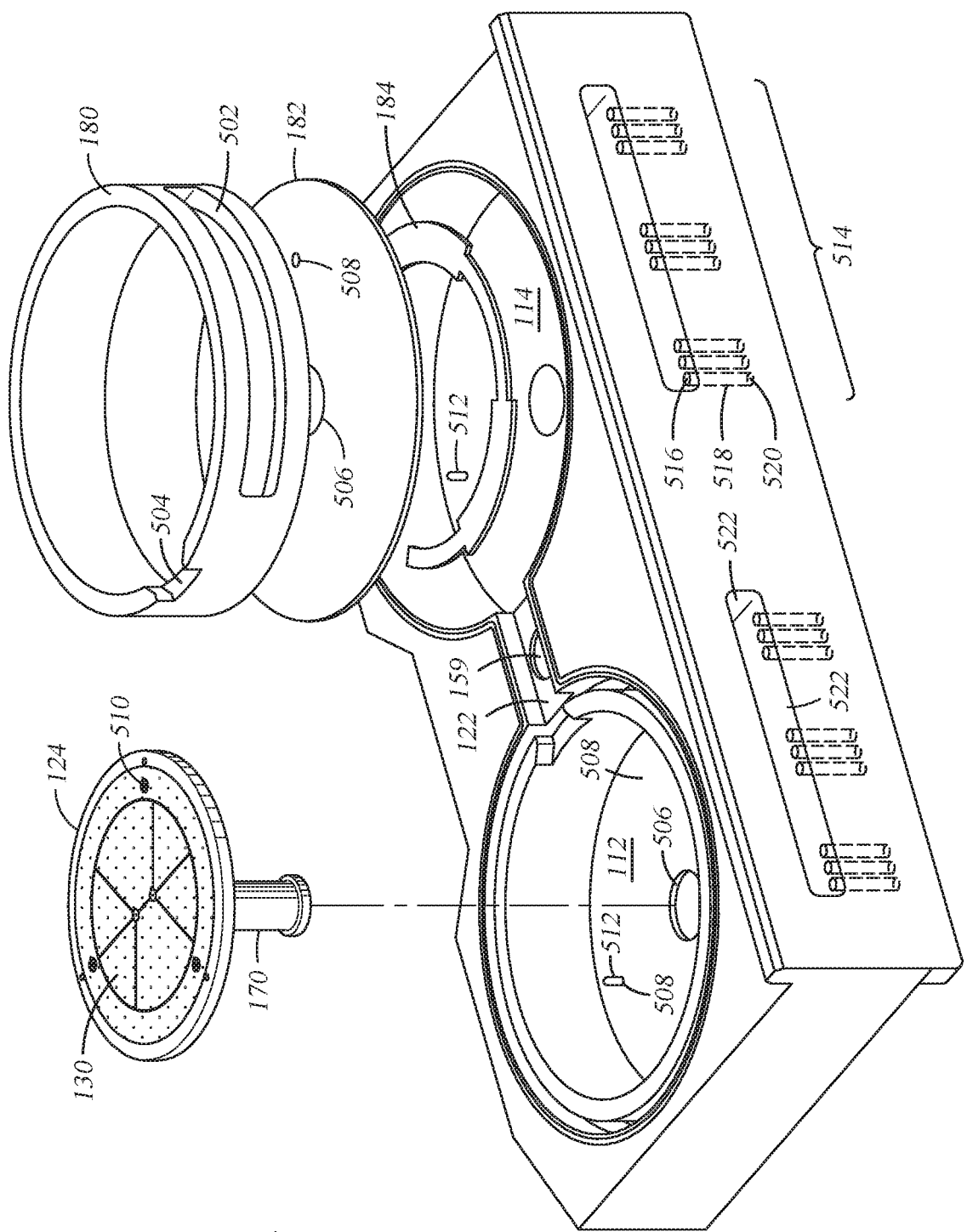
FIG. 5 is a partial exploded view of the apparatus of FIG. 1 showing internal features of the apparatus.

FIG. 5 is a partial exploded view of the apparatus 100 with the lid 106, and all attachments thereto, removed to show internal features of the apparatus 100. The passage 122 and the recess 159 are visible, as are the wall liner 180, the floor liner 182, and the thermal liner 184. The processing chamber 112 is shown with the liners 180, 182, installed, while the processing chamber 114 is shown with the liners spaced apart for clarity. The substrate support 124 is shown spaced apart from the processing chamber 112, and is not shown for the processing chamber 114. The floor liner 182 has an opening 506 to admit the conduit 170 of the substrate support 124. The wall liner 180 has an opening 502 to allow substrates to enter and exit each chamber, and a notch 504 for flowing gases from the passage 122 (and liner 156, not shown in FIG. 5) into each chamber. The floor liners 182 also have a plurality of openings 508 to allow lifts pins 512 to transport substrates to and from the substrate supporting area 130. The substrate support 124 has openings 510 that register with the openings 508 in the floor liner 182.

The view in FIG. 5 is from the opposite side of the apparatus 100 relative to the view of FIG. 1, and shows substrate access openings 522, one for each of the processing chambers 112, 114. Each of the substrate access openings 522 features a plurality of purge gas ports 516 grouped together in a plurality of groups 514. Each purge gas port 516 has a corresponding conduit 518 and purge gas inlet port 520. The purge gas inlet ports 520 are located at a bottom edge of the body 102, and provide a location to couple a source of purge gas to the body 102. As shown in FIG. 5, the body 102 has an external wall with a first edge proximate the lid and a second edge opposite the first edge, the purge gas portal is formed in the second edge of the external wall, and a passage through the external wall fluidly couples each substrate access opening to a corresponding purge gas portal. During processing, doors cover and seal the substrate access openings 522, so purge gas flowing through the purge gas inlet ports 520, conduits 518 and ports 516 flows into the substrate access opening 522 and toward the chamber exhaust at the center of the chamber. This prevents process gases from accumulating in the substrate access opening 522 and depositing material thereon.

While the foregoing is directed to embodiments of the present invention, other and further embodiments of the invention may be devised without departing from the basic scope thereof, and the scope thereof is determined by the claims that follow.

What is claimed is:

1. A semiconductor processing apparatus, comprising:
   a body with a wall defining two processing chambers within the body;
   a passage through the wall forming a fluid coupling between the two processing chambers;
   a lid removably coupled to the body, the lid having a portal in fluid communication with the passage;
   a chemically inactive liner in the passage, the chemically inactive liner having an opening in registration with the portal of the lid;
   a gas activator coupled to the lid outside the processing chambers, the gas activator having an outlet in fluid communication with the portal of the lid;
   a substrate support disposed in each processing chamber, each substrate support having at least two heating zones;
   a gas distributor coupled to the lid facing each substrate support; and
   a thermal control conduit coupled to the lid at an edge of each gas distributor.

2. The semiconductor processing apparatus of claim 1, wherein the chemically inactive liner is quartz.

3. The semiconductor processing apparatus of claim 1, further comprising a source of activating gas, a source of oxygen-containing gas, a source of nitrogen containing gas, and a source of prolonging gas coupled to an inlet of the gas activator.

4. The semiconductor processing apparatus of claim 3, wherein the activating gas is Ar or He, the oxygen-containing gas is $O_2$, CO, or $CO_2$, the nitrogen containing gas is $N_2$, $NF_3$, or $NH_3$, and the prolonging gas is $N_2$ or He.

5. The semiconductor processing apparatus of claim 1, wherein the gas activator is a remote plasma source, and the outlet of the gas activator is a high flow outlet.

6. The semiconductor processing apparatus of claim 1, wherein each of the substrate supports has a substrate supporting area comprising a plurality of substrate supporting surfaces extending from the substrate supporting area.

7. The semiconductor processing apparatus of claim 1, wherein the body has a substrate access opening for each processing chamber through an external wall of the body, and the external wall has a purge gas portal in fluid communication with each substrate access opening.

8. The semiconductor processing apparatus of claim 7, wherein the external wall has a first edge proximate the lid and a second edge opposite the first edge, and the purge gas portal is formed in the second edge of the external wall.

9. The semiconductor processing apparatus of claim 8, wherein each substrate access opening has a plurality of purge gas portals arranged in a plurality of groups.

10. A semiconductor processing apparatus, comprising:
    a body with a wall defining two processing chambers within the body, each processing chamber having a floor with an exhaust opening and a pumping block coupled to the floor, the pumping block having an opening that matches the exhaust opening, the pumping block having an annular pumping channel coupled to the opening of the pumping block by a plurality of pumping portals, the pumping block having an outlet fluidly coupled to the annular pumping channel;
    a passage through the wall forming a fluid coupling between the two processing chambers;
    a lid removably coupled to the body, the lid having a portal in fluid communication with the passage;
    a chemically inactive liner in the passage, the chemically inactive liner having an opening in registration with the portal of the lid;
    a gas activator coupled to the lid outside the processing chambers, the gas activator having an outlet in fluid communication with the portal of the lid;
    a substrate support disposed in each processing chamber, each substrate support having at least two heating zones, each of the substrate supports having a substrate supporting area comprising a plurality of substrate supporting surfaces extending from the substrate supporting area, the substrate support having a conduit disposed through the exhaust opening and the opening of the pumping block;
    a gas distributor coupled to the lid facing each substrate support; and
    a thermal control conduit coupled to the lid at an edge of each gas distributor.

11. A semiconductor processing apparatus, comprising:
    a body with a wall defining two processing chambers within the body;
    a passage through the wall forming a fluid coupling between the two processing chambers;

a lid removably coupled to the body, the lid having a portal in fluid communication with the passage;

a quartz liner disposed in the passage, the quartz liner having an opening in registration with the portal of the lid;

a gas activator coupled to the lid outside the processing chambers, the gas activator having an outlet in fluid communication with the portal of the lid;

a substrate support disposed in each processing chamber, each substrate support having at least two heating zones and a substrate supporting area comprising a plurality of substrate supporting surfaces extending from the substrate supporting area;

a gas distributor coupled to the lid facing each substrate support; and a thermal control conduit coupled to the lid at an edge of each gas distributor.

12. The semiconductor processing apparatus of claim 11, wherein each processing chamber has a floor with an exhaust opening and a pumping block coupled to the floor, wherein the pumping block has an opening that matches the exhaust opening, the pumping block has an annular pumping channel coupled to the opening of the pumping block by a plurality of pumping portals, the pumping block has an outlet fluidly coupled to the annular pumping channel, and the substrate support has a conduit disposed through the exhaust opening and the opening of the pumping block.

13. The semiconductor processing apparatus of claim 11, wherein the body has a substrate access opening for each processing chamber through an external wall of the body, and the external wall has a purge gas portal in fluid communication with each substrate access opening.

14. The semiconductor processing apparatus of claim 13, where the external wall has a first edge proximate the lid and a second edge opposite the first edge, the purge gas portal is formed in the first edge of the external wall.

15. A semiconductor processing apparatus, comprising:

a body with a wall defining two processing chambers within the body, each processing chamber having a floor with an exhaust opening and a pumping block coupled to the floor, the pumping block having an opening that matches the exhaust opening, an annular pumping channel coupled to the opening of the pumping block by a plurality of pumping portals, and an outlet fluidly coupled to the annular pumping channel;

a passage through the wall forming a fluid coupling between the two processing chambers;

a lid removably coupled to the body, the lid having a portal in fluid communication with the passage;

a chemically inactive liner in the passage, the chemically inactive liner having an opening in registration with the portal of the lid;

a remote plasma unit coupled to the lid outside the processing chambers, the remote plasma unit having an outlet in fluid communication with the portal of the lid;

a substrate support disposed in each processing chamber, each substrate support having at least two heating zones and a substrate supporting area comprising a plurality of substrate supporting surfaces extending from the substrate supporting area, the substrate support having a conduit disposed through the exhaust opening and the opening of the pumping block;

a gas distributor coupled to the lid facing each substrate support; and a thermal control conduit coupled to the lid at an edge of each gas distributor.

16. The semiconductor processing apparatus of claim 15, wherein the chemically inactive liner comprises quartz.

* * * * *